(12) United States Patent
Lin et al.

(10) Patent No.: US 8,179,919 B2
(45) Date of Patent: May 15, 2012

(54) METHOD AND APPARATUS FOR DATA PACKAGE IN BROADCAST NETWORKS

(75) Inventors: Chen-Long Lin, I-Lan (TW);
Cheng-Peng Kuan, Hsinchu (TW);
Jhih-Wei Jiang, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 601 days.

(21) Appl. No.: 12/472,663

(22) Filed: May 27, 2009

(65) Prior Publication Data
US 2010/0157871 A1 Jun. 24, 2010

(30) Foreign Application Priority Data
Dec. 23, 2008 (TW) ................ 97150305 A (51) Int. Cl.
*H04J 3/26* (2006.01)
*H04J 3/24* (2006.01)
*H04J 3/00* (2006.01)

(52) U.S. Cl. ............ 370/474; 370/432; 370/476

(58) Field of Classification Search .......... None
See application file for complete search history.

(56) References Cited

U.S. PATENT DOCUMENTS

| | | | |
|---|---|---|---|
| 6,012,159 A | * | 1/2000 | Fischer et al. ............ 714/755 |
| 7,418,651 B2 | | 8/2008 | Luby et al. |
| 2004/0093550 A1 | * | 5/2004 | Kadatch et al. ............ 714/752 |
| 2004/0179487 A1 | * | 9/2004 | Matsugatani et al. ....... 370/320 |

OTHER PUBLICATIONS

"Fountain Codes and Applications to Reliable Wireless Broadcast System", Yuanyuan Ma, Dongfeng Yuan, Haixia Zhang Proceedings of 2006 IEEE Information Theory Workshop (ITW'06) Authorized licensed use limited to: Industrial Technology Research Institute. Downloaded on Oct. 16, 2008 at.

* cited by examiner

*Primary Examiner* — Kwang B Yao
*Assistant Examiner* — Jutai Kao
(74) *Attorney, Agent, or Firm* — Lin & Associates IP, Inc.

(57) ABSTRACT

Disclosed relates to a method and apparatus for data transmission in broadcast networks, in which N×K pieces of inputted application data are segmented into a matrix $B_{N \times K}$ formed by N blocks $B_1$-$B_N$. Each of N blocks contains K pieces of application data, and both N and K are greater than 1. A matrix $C_{M \times N}$ with full column rank N is selected, where $M \geq N$. After that, an encoded data module consisting of M row matrix $E_1$-$E_M$ is generated by performing a matrix multiplication on $C_{M \times N}$ and $B_{N \times K}$. Then, for each I, $1 \leq I \leq M$, two row matrixes $C_I$ and $E_I$ are packaged, and all of the M packaged data ($C_I$, $E_I$) are sent out.

21 Claims, 10 Drawing Sheets

METHOD AND APPARATUS FOR DATA PACKAGE IN BROADCAST NETWORKS

TECHNICAL FIELD

The technical field generally relates to a method and apparatus for data package in broadcast networks.

BACKGROUND

Digital TV, in addition to transmitting audio-visual multimedia services, also needs to transmit extra data to provide diverse services to users, such as, downloading applications to the receiver for execution to match the program contents. For example, during a baseball game broadcast, the user may download a baseball game to the receiver so that the user may watch the real game while playing the electronic game. The transmission of the electronic game requires extra transmission mechanism that must correctly transmit required data, such as, application program. This transmission mechanism is different from transmitting audio-visual data. Minor errors during the transmission of audiovisual data will not serious impair the decoding of the audio-visual data. On the other hand, a small error in the transmission of program files, regardless the size of the data, the receiver will not be able to correctly execute the application program.

Figure 1:
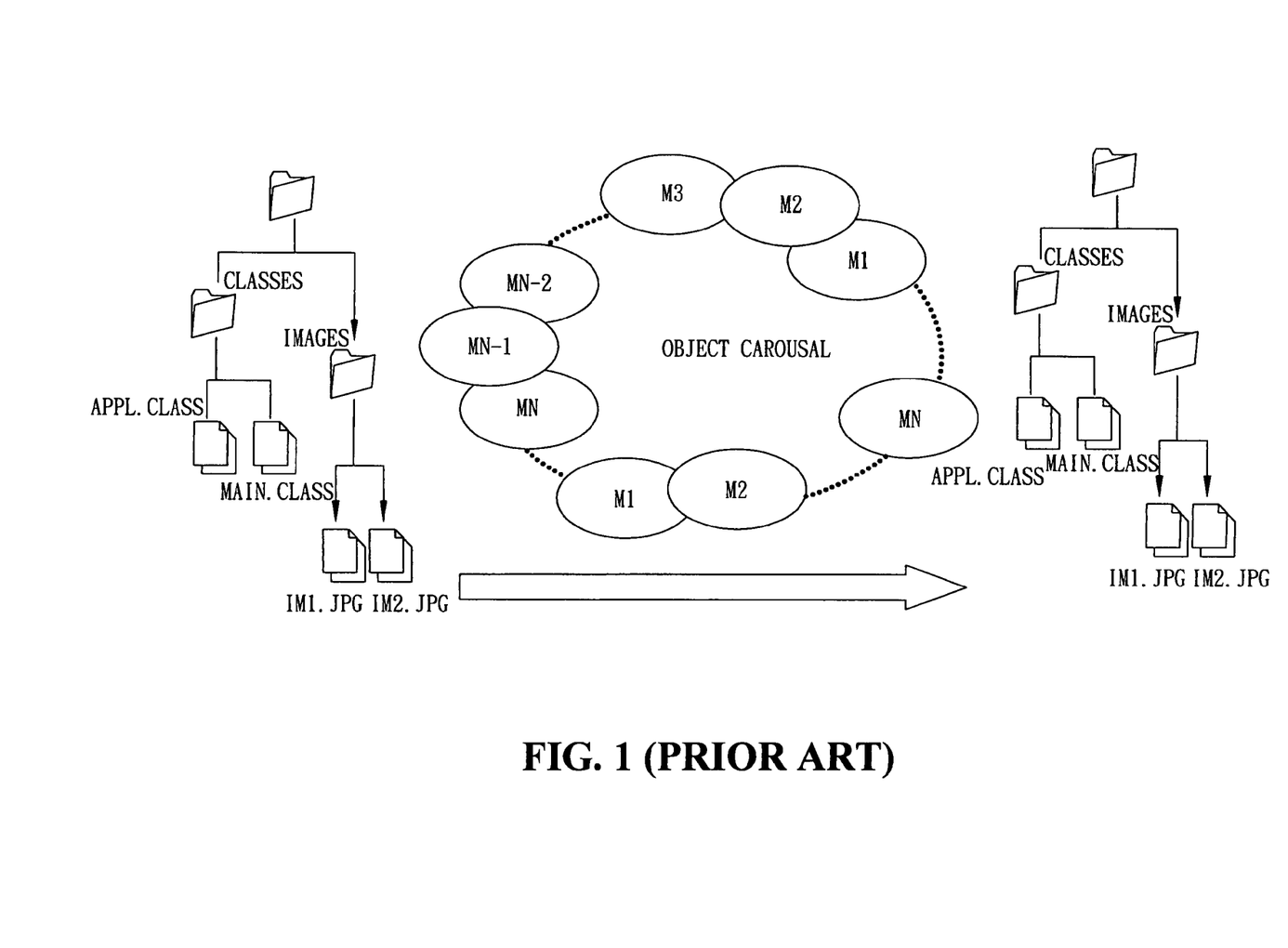
FIG. 1 shows an exemplary schematic view of a transmission mechanism for digital storage media, commands and control.

To transmit and receive files and data correctly, broadcast network usually adopts the transmission mechanism, such as, Digital Storage Media, Command and Control (DSMCC). As shown in FIG. 1, the DSMCC transmission mechanism divides the file or data to be transmitted into a plurality of modules, M1, M2, . . . , MN. The modules are transmitted in the broadcast network in an object carousel manner. When the receiver starts to receive the data, the receiver does not know which module to start with because the starting time for receiving is not fixed. Therefore, the transmission mechanism uses the uni-direction cyclic manner of the object carousel to transmit the plural modules. After the receiver receives the plural modules M1, M2, . . . , MN correctly, the receiver reconstructs the file or data according to the header description of each module.

In this transmission mechanism, if an error occurs in receiving a certain module, the receiver must wait until the next transmission of the same module to ensure the correctness because it is impossible to request the retransmission of the module in a uni-direction broadcast network. Hence, the receiver needs more time to ensure the completeness and the correctness of the received data.

Figure 2:
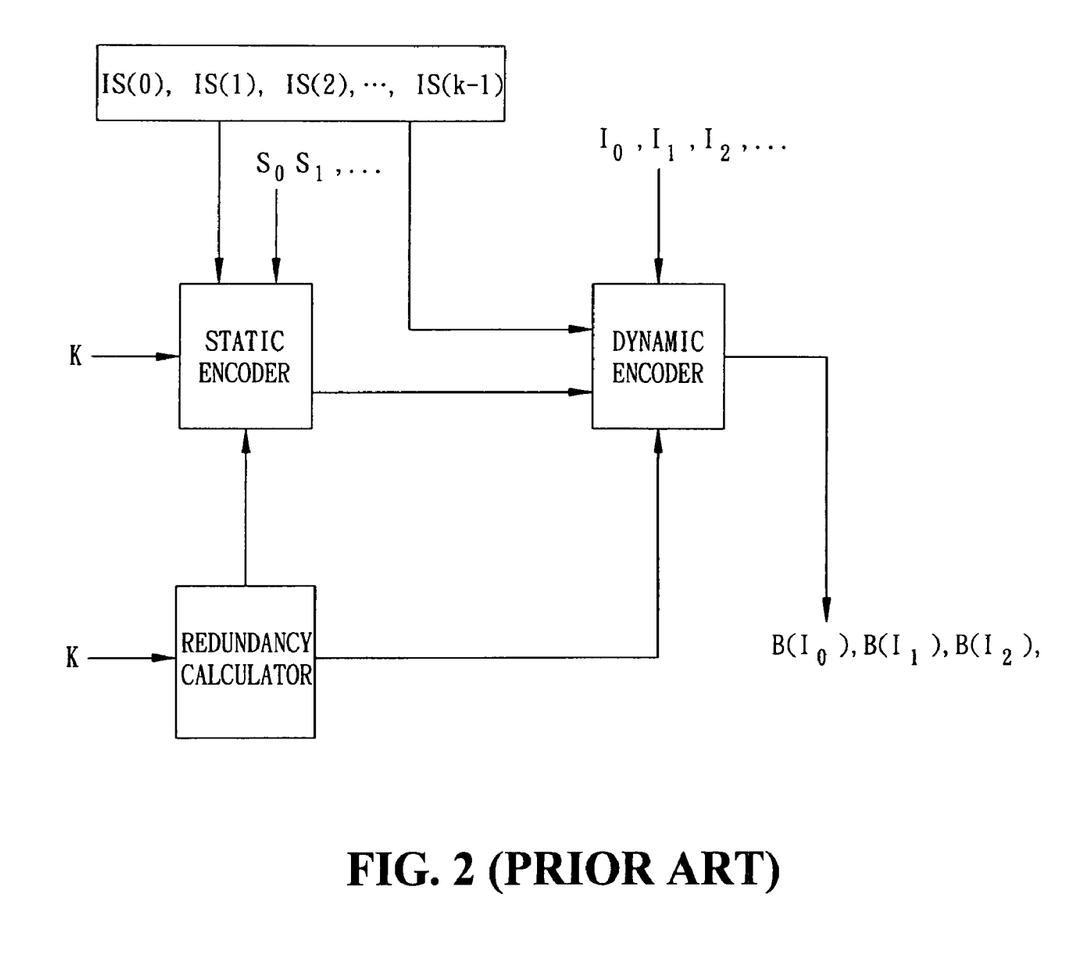
FIG. 2 shows an exemplary schematic view of a system for multi-file downloading and streaming.

U.S. Pat. No. 7,418,651 disclosed a file download and streaming system. As shown in FIG. 2, in a broadcasting environment, a multi-stage encoding method is used to encode the sequential data IS(0), IS(1), IS(2), . . . , IS(k−1) of an input file or the stream into $B(I_0), B(I_1), B(I_2), \ldots$, before transmission.

Figure 3:
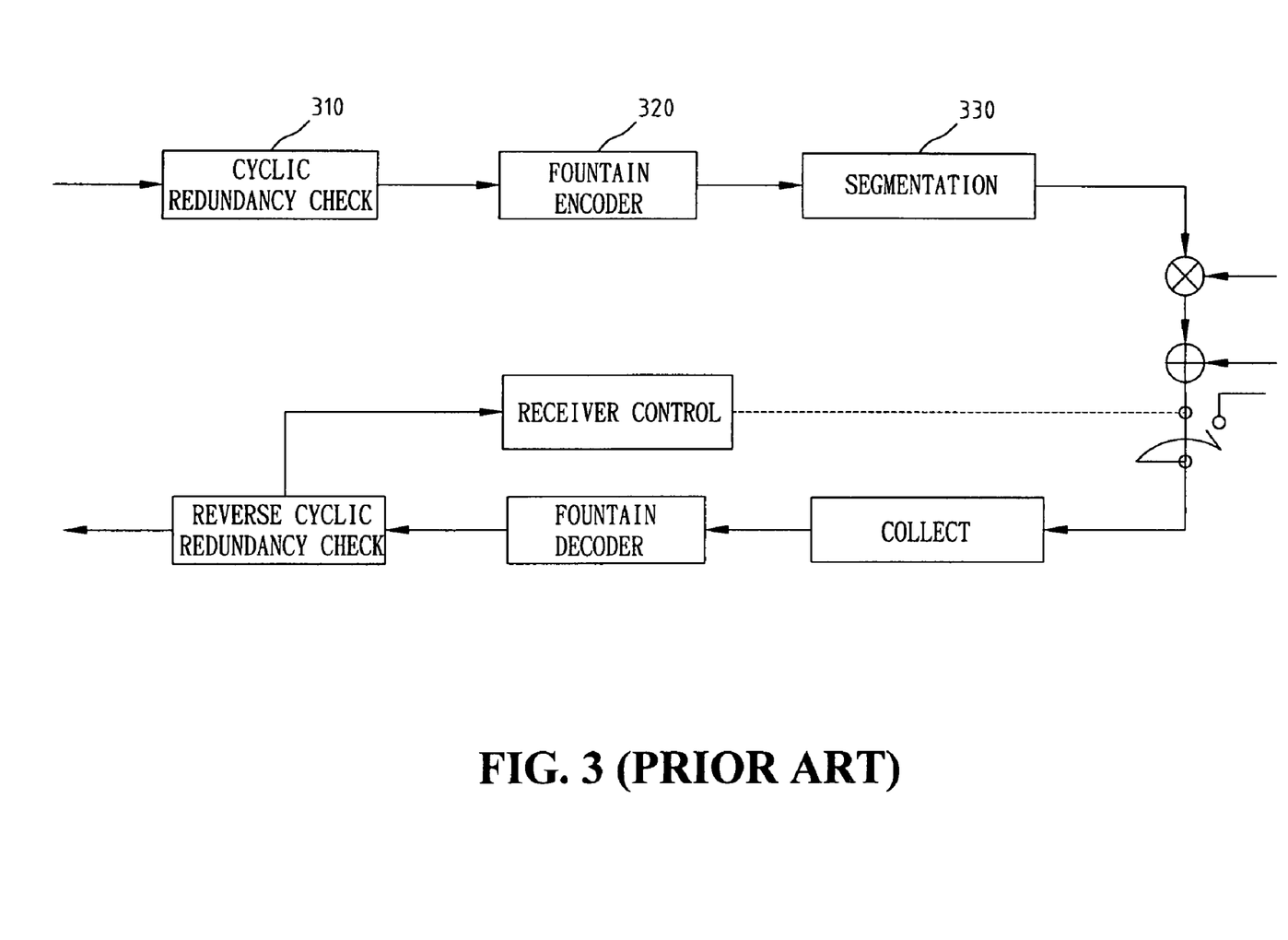
FIG. 3 shows an exemplary schematic view of the fountain code and application of a reliable wireless broadcasting system.

Yuanyuan Ma et. al, disclosed in 2006 a fountain codes and applications to reliable wireless broadcast system. The technique is based on the fountain codes to provide a framework of flexible code rate to allow the concurrent reliable wireless broadcast and asynchronous data access. A shown in FIG. 3, in this framework, sequence v', after appending cyclic redundancy check (CRC) 310 after data sequence v, is fountain encoded by a fountain encoder 320, and then the continuous symbol sequence is fragmented 330 to become a plurality of small segments for data transmission.

SUMMARY

The disclosed exemplary embodiments may provide a method and apparatus for data package in broadcast networks.

In an exemplary embodiment, the disclosed relates to a method for data package in broadcast networks, comprising: segmenting N×K pieces of inputted application data into a matrix $B_{N \times K}$ formed by N blocks $B_1$-$B_N$, with each of N blocks containing K pieces of application data, and both N and K being integers greater than 1; selecting a matrix $C_{M \times N}$ formed by M row matrixes $C_1$-$C_M$, with full column rank N, where M≧N, and both being positive integers; performing matrix multiplication on $C_{M \times N}$ and $B_{N \times K}$ to produce an encoded data module consisting of M row matrix $E_1$-$E_M$; and for each I, 1≦I≦M, packaging two row matrixes $C_I$ and $E_I$, and transmitting all of the M packaged data $(C_I, E_I)$.

In another exemplary embodiment, the disclosed relates to an apparatus for data package in broadcast networks, comprising a data packager and an encoder. The data packager is connected to the encoder. The data packager segments N×K pieces of inputted application data into a matrix $B_{N \times K}$ formed by N blocks $B_1$-$B_N$, with each of N blocks containing K pieces of application data, and both N and K are both integers greater than 1. The encoder selects a coefficient matrix $C_{M \times N}$ with full column rank N and generates an encoded data module $E_{M \times K}$ by performing a linear combination encoding on coefficient matrix $C_{M \times N}$ and N blocks $B_{N \times K}$. Then, the coefficient of each block $C_I$ is packaged with block $E_I$ data, and the M packaged data $(C_I, E_I)$ are transmitted, where M≧N and 1≦I≦M.

Yet in another exemplary embodiment, the disclosed relates to a transmitter of broadcast networks. The transmitter comprises a data package apparatus, a multiplexer, and a radio frequency (RF) stage. The data packager segments N×K pieces of inputted application data into N blocks $B_1$-$B_N$, selects M row matrixes $C_1$-$C_M$, performs a linear combination encoding on coefficient matrix $C_{M \times N}$ and N blocks $B_{N \times K}$ to generate an encoded data module $E_{M \times K}$, and then transmits M packaged data $(C_I, E_I)$, where M≧N and 1≦I≦M. The multiplexer mixes at least a program and the M packaged data $(C_I, E_I)$, where 1≦I≦M, into a transport stream. The RF stage modulates and shifts the transport stream to convert into a suitable digital video broadcast (DVB) signal for transmission.

Yet in another exemplary embodiment, the disclosed relates to a transmission and receiving system of broadcast networks, comprising a transmitter and a receiver. The transmitter at least has a data package apparatus to segment N×K pieces of inputted application data into N blocks $B_1$-$B_N$, select M row matrixes $C_1$-$C_M$, perform a linear combination encoding on coefficient matrix $C_{M \times N}$ and N blocks $B_{N \times K}$ to generate an encoded data module $E_{M \times K}$ formed by M row matrixes $E_1$-$E_M$, and then transmit M packaged data $(C_I, E_I)$, where M≧N and 1≦I≦M. The receiver at least has a data composer, using a Gaussian elimination to obtain N blocks $B_1$-$B_N$ from M packaged data and reconstructs to N×K pieces of inputted application data.

The foregoing and other possible features, aspects and advantages of the present invention will become better understood from a careful reading of a detailed description provided herein below with appropriate reference to the accompanying drawings.

DETAILED DESCRIPTION

The disclosed exemplary embodiments use data packaging technique to perform uni-direction data transmission in broadcast networks. The disclosed embodiments comprises at least a data packager, and the data packager may segment the application data, such as, input file or stream, into a plurality of data blocks so that when transmitting data or file in broadcast networks, the time required at the receiver may be reduced while maintaining the correctness and completeness of the data transmission.

Accordingly, the segmentation is to combine the related theory of matrix transformation and Galois Field as the theoretic basis, and the inputted application data is segmented into N blocks, where N is a positive integer greater than 1. A coefficient matrix is selected, and the matrix computation is performed on the coefficient matrix and the segmented data to generate coded data module. Then, each block of the coded data module is transmitted with the coefficient. In this manner, the receiver only needs to receive any N (or more than N) of the M packages including coefficient and data block transmitted from the front end in order to reconstruct to the original data, where M is a positive integer and $M \geq N$.

Figure 4:
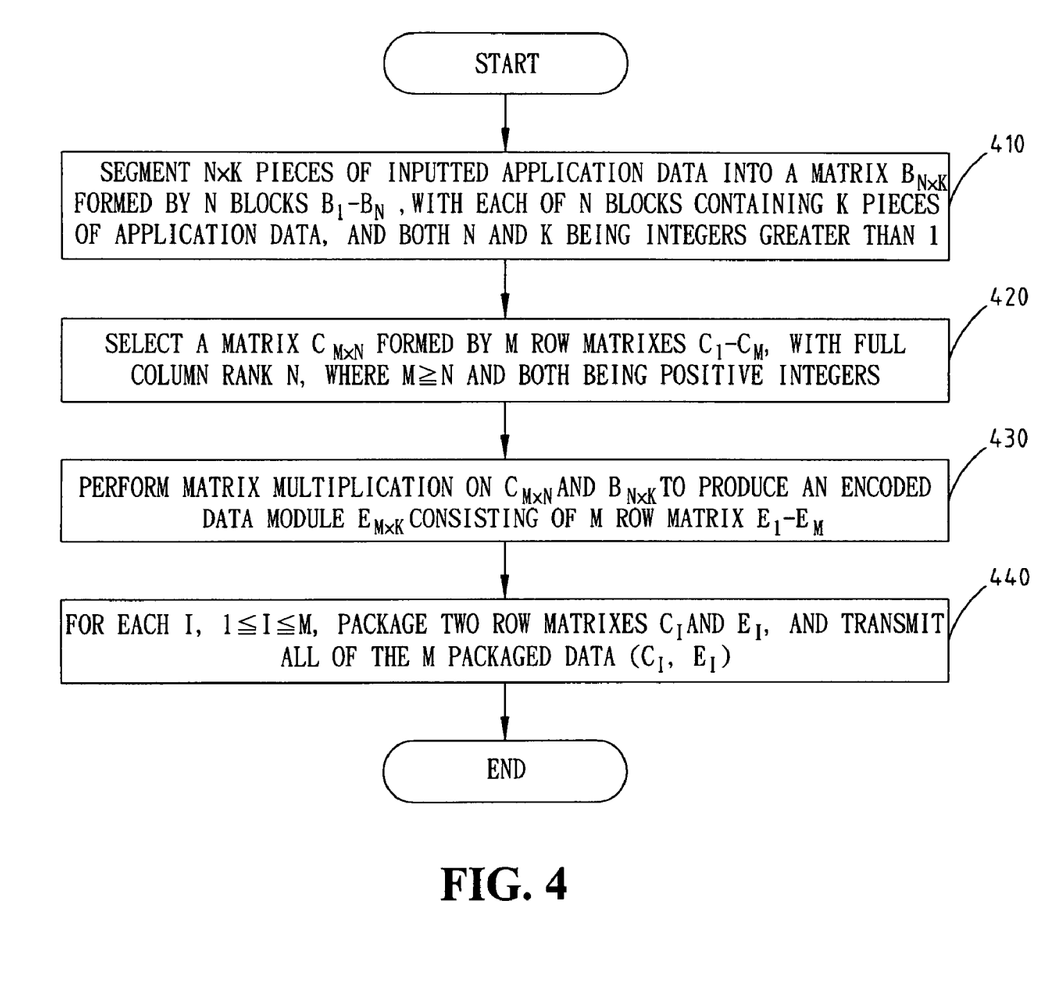
FIG. 4 shows an exemplary flowchart of a method for data package in broadcast networks, consistent with certain disclosed embodiments.

FIG. 4 shows an exemplary flowchart of a method for data package in broadcast networks, consistent with certain disclosed embodiments. Referring to FIG. 4, as shown in step 410, N×K pieces of inputted application data are segmented into a matrix $B_{N \times K}$ formed by N blocks $B_1$-$B_N$, with each of N blocks containing K pieces of application data, and both N and K being integers greater than 1. In other words, matrix $B_{N \times K}$ is formed by N×K matrixes with each matrix having K elements and each element being a piece of application data.

Then, a matrix $C_{M \times N}$ formed by M row matrixes $C_1$-$C_M$, with full column rank N, where $M \geq N$ and both being positive integers is selected, as shown in step 420. In step 430, matrix multiplication on $C_{M \times N}$ and $B_{N \times K}$ is performed to produce an encoded data module $E_{M \times K}$ consisting of M row matrix $E_1$-$E_M$. In other words, encoded data module $E_{M \times K}$ is the product matrix of matrix $C_{M \times N}$ and matrix $B_{N \times K}$, i.e., $E_{M \times K} = C_{M \times N} \times B_{N \times K}$. M is a pre-defined positive integer.

In step 420, matrix $C_{M \times N}$ has M coefficients, i.e., M1×N row matrixes $C_1$-$C_M$. In step 430, encoded data module $E_{M \times K}$ has M data blocks, i.e., M1×K row matrixes $E_1$-$E_M$. Then, the coefficient $C_I$ is packaged with data block $E_I$, M packages data $(C_I, E_I)$ are transmitted, where $1 \leq I \leq M$. Step 440 is, for each I, $1 \leq I \leq M$, to package two row matrixes $C_I$ and $E_I$, and transmit all of the M packaged data $(C_I, E_I)$.

In this manner, the receiver only needs to receive any N (or more than N) of the M packaged data transmitted from the front end in order to reconstruct to the original data, i.e., the original N×K pieces of application data. The steps of the method need not take whether N×K pieces of application data are sequential into account.

To clarify the exemplary embodiments, the following sequential values as the application data for transmission. Assume that the original data sequence is: 8-bit data of 0, 1, 2, . . . , 35. The original data is segmented into 6 parts, i.e., N=6. Hence, K=36/6=6, and the pre-defined positive integer M=10, i.e., encoded data module $E_{M \times K}$ will expand four more blocks, $E_7$, $E_8$, $E_9$, $E_{10}$. Matrixes $B_{6 \times 6}$, $C_{10 \times 6}$, and $E_{10 \times 6}$, are as follows.

Original data is segmented into $B_{6 \times 6}$, where $B_1$ to $B_6$ are as follows:

| | | | | | | |
|---|---|---|---|---|---|---|
| $B_1$: | 0 | 1 | 2 | 3 | 4 | 5 |
| $B_2$: | 6 | 7 | 8 | 9 | 10 | 11 |
| $B_3$: | 12 | 13 | 14 | 15 | 16 | 17 |
| $B_4$: | 18 | 19 | 20 | 21 | 22 | 23 |
| $B_5$: | 24 | 25 | 26 | 27 | 28 | 29 |
| $B_6$: | 30 | 31 | 32 | 33 | 34 | 35 |

Select $C_{10 \times 6}$, where $C_{10 \times 6}$ is full column rank 6. To clarify, select the row matrixes $C_1$ to $C_6$ to become identity matrix as example for explanation. Therefore, $C_1$ to $C_{10}$ are as follows:

| | | | | | | |
|---|---|---|---|---|---|---|
| $C_1$: | 1 | 0 | 0 | 0 | 0 | 0 |
| $C_2$: | 0 | 1 | 0 | 0 | 0 | 0 |
| $C_3$: | 0 | 0 | 1 | 0 | 0 | 0 |
| $C_4$: | 0 | 0 | 0 | 1 | 0 | 0 |
| $C_5$: | 0 | 0 | 0 | 0 | 1 | 0 |
| $C_6$: | 0 | 0 | 0 | 0 | 0 | 1 |
| $C_7$: | 1 | 22 | 39 | 226 | 86 | 180 |
| $C_8$: | 201 | 77 | 156 | 218 | 121 | 241 |
| $C_9$: | 41 | 105 | 93 | 1 | 126 | 223 |
| $C_{10}$: | 30 | 49 | 28 | 42 | 76 | 225 | where each element of $C_8$ to $C_{10}$ is randomly generated by $GF(2^8)$; therefore, each element is also 8-bit data, with value between 0 and 255.

Matrix $C_{10 \times 6}$ and matrix $B_{6 \times 6}$ are multiplied to obtain matrix $E_{10 \times 6}$, where $E_1$ to $E_{10}$ are as follows:

| | | | | | | |
|---|---|---|---|---|---|---|
| $E_1$: | 0 | 1 | 2 | 3 | 4 | 5 |
| $E_2$: | 6 | 7 | 8 | 9 | 10 | 11 |
| $E_3$: | 12 | 13 | 14 | 15 | 16 | 17 |
| $E_4$: | 18 | 19 | 20 | 21 | 22 | 23 |
| $E_5$: | 24 | 25 | 26 | 27 | 28 | 29 |
| $E_6$: | 30 | 31 | 32 | 33 | 34 | 35 |
| $E_7$: | 200 | 248 | 64 | 112 | 146 | 162 |
| $E_8$: | 165 | 239 | 221 | 151 | 88 | 18 |
| $E_9$: | 153 | 36 | 82 | 239 | 118 | 203 |
| $E_{10}$: | 135 | 51 | 52 | 128 | 89 | 237 |

Galois Field GF is a common linear algebra, and matrix multiplication is executed according to the multiplication defined by $GF(2^8)$. When matrix $C_{10\times 6}$ and matrix $B_{6\times 6}$ are multiplied, because the first 6×6 matrix of $C_{10\times 6}$ is an identity matrix, $E_1$ to $E_6$ of matrix $E_{10\times 6}$ are also the same as $B_1$ to $B_6$.

According to the exemplary flowchart of FIG. 4, the 10 packaged data $(C_I, E_I)$, $1 \leq i \leq 10$ are transmitted. In other words, when transmitting data from the front end, the original data to be transmitted is segmented into 6 data blocks (i.e., $B_1$ to $B_6$), and then compute on the 6 data blocks (i.e., $B_1$ to $B_6$) and coefficient matrix $C_{10\times 6}$ to expand into 10 blocks (i.e., $E_1$ to $E_{10}$). The receiver only needs to receive any 6 (or more than 6) of 10 packaged data (i.e., $(C_I, E_I)$, $1 \leq I \leq 10$) to reconstruct the original data.

Assume that the receiver only receives any 6 packaged data, such as, $(C_1, E_1)$, $(C_3, E_3)$, $(C_5, E_5)$, $(C_7, E_7)$, $(C_8, E_8)$, $(C_9, E_9)$. The following describes how the receiver combines the Gaussian elimination to reconstruct the original data. In performing Gaussian elimination, the coefficient $C_I$ and data block $E_I$ are put together for computation. The first six are the coefficient part and the remaining is the data part. When the coefficient part becomes the identity matrix, the data part will be restored to the original data. In the $GF(2^8)$ computation, any value multiplied by 1 will become 0 and any value multiplied by own inverse factor will become 1.

The following describes how to reconstruct $(C_1, E_1)$, $(C_3, E_3)$, $(C_5, E_5)$, $(C_7, E_7)$, $(C_8, E_8)$, $(C_9, E_9)$ into the original data.

Step 1: At the beginning, the receiver receives $(C_1, E_1)$ and $(C_7, E_7)$,

| | | | | | | | | | | | |
|---|---|---|---|---|---|---|---|---|---|---|---|
| $(C_1, E_1)$: | 1 | 0 | 0 | 0 | 0 | 0 | 0 | 1 | 2 | 3 | 4 | 5 |
| $(C_7, E_7)$: | 1 | 22 | 39 | 226 | 86 | 180 | 200 | 248 | 64 | 112 | 146 | 162 |

According to the multiplication defined by $GF(2^8)$ to execute the multiplication of $(C_1, E_1)$ and $(C_7, E_7)$. The object is to change the first element of $(C_7, E_7)$ to 0, the result of the multiplication is as follows:

| | | | | | | | | | | | |
|---|---|---|---|---|---|---|---|---|---|---|---|
| $(C_1, E_1)$: | 1 | 0 | 0 | 0 | 0 | 0 | 0 | 1 | 2 | 3 | 4 | 5 |
| $(C_7, E_7)$: | 0 | 22 | 39 | 226 | 86 | 180 | 200 | 249 | 66 | 115 | 150 | 167 |

Step 2: change the second element 22 of $(C_7, E_7)$ to 1 to facilitate the coefficient part transforms back to identity matrix. Therefore, all the elements of $(C_7, E_7)$ are multiplied by the inverse multiplication element of 22 defined by $GF(2^8)$. The result of the multiplication is as follows:

| | | | | | | | | | | | |
|---|---|---|---|---|---|---|---|---|---|---|---|
| $(C_1, E_1)$: | 1 | 0 | 0 | 0 | 0 | 0 | 0 | 1 | 2 | 3 | 4 | 5 |
| $(C_7, E_7)$: | 0 | 1 | 140 | 206 | 235 | 37 | 121 | 244 | 144 | 255 | 200 | 69 |

Step 3: the receiver receives $(C_3, E_3)$ and $(C_8, E_8)$.

| | | | | | | | | | | | |
|---|---|---|---|---|---|---|---|---|---|---|---|
| $(C_1, E_1)$: | 1 | 0 | 0 | 0 | 0 | 0 | 0 | 1 | 2 | 3 | 4 | 5 |
| $(C_7, E_7)$: | 0 | 1 | 140 | 206 | 235 | 37 | 121 | 244 | 114 | 255 | 200 | 69 |
| $(C_3, E_3)$: | 0 | 0 | 1 | 0 | 0 | 0 | 12 | 13 | 14 | 15 | 16 | 17 |
| $(C_8, E_8)$: | 201 | 77 | 156 | 218 | 121 | 241 | 165 | 239 | 221 | 151 | 88 | 18 |

Change the first element 201, second element 156 and third element 218 of $(C_8, E_8)$ to 0 to facilitate the coefficient part transforms back to identity matrix. Therefore, according to the multiplication defined by $GF(2^8)$ to execute the multiplication of $(C_1, E_1)$ and $(C_8, E_8)$, multiplication of $(C_7, E_7)$ and $(C_8, E_8)$, and multiplication of $(C_3, E_3)$ and $(C_8, E_8)$. Then, the fourth element of $(C_8, E_8)$ is changed to 1. The result of the computation is as follows:

| | | | | | | | | | | | |
|---|---|---|---|---|---|---|---|---|---|---|---|
| $(C_1, E_1)$: | 1 | 0 | 0 | 0 | 0 | 0 | 0 | 1 | 2 | 3 | 4 | 5 |
| $(C_7, E_7)$: | 0 | 1 | 140 | 206 | 235 | 37 | 121 | 244 | 114 | 255 | 200 | 69 |
| $(C_3, E_3)$: | 0 | 0 | 1 | 0 | 0 | 0 | 12 | 13 | 14 | 15 | 16 | 17 |
| $(C_8, E_8)$: | 0 | 0 | 0 | 1 | 195 | 156 | 38 | 120 | 31 | 65 | 136 | 214 |

Step 4: the receiver receives ($C_5$, $E_5$) and ($C_9$, $E_9$).

| | | | | | | | | | | | | |
|---|---|---|---|---|---|---|---|---|---|---|---|---|
| ($C_1$, $E_1$): | 1 | 0 | 0 | 0 | 0 | 0 | 0 | 1 | 2 | 3 | 4 | 5 |
| ($C_7$, $E_7$): | 0 | 1 | 140 | 206 | 235 | 37 | 121 | 244 | 114 | 255 | 200 | 69 |
| ($C_3$, $E_3$): | 0 | 0 | 1 | 0 | 0 | 0 | 12 | 13 | 14 | 15 | 16 | 17 |
| ($C_8$, $E_8$): | 0 | 0 | 0 | 1 | 195 | 156 | 38 | 120 | 31 | 65 | 136 | 214 |
| ($C_5$, $E_5$): | 0 | 0 | 0 | 0 | 1 | 0 | 24 | 25 | 26 | 27 | 28 | 29 |
| ($C_9$, $E_9$): | 41 | 105 | 93 | 1 | 126 | 223 | 153 | 36 | 82 | 239 | 118 | 203 |

Change the first element 41, second element 105, third element 93 and fourth element 1 of ($C_9$, $E_9$) to 0 to facilitate the coefficient part transforms back to identity matrix. Therefore, according to the multiplication defined by $GF(2^8)$ to execute the multiplication of ($C_1$, $E_1$) and ($C_9$, $E_9$), multiplication of ($C_7$, $E_7$) and ($C_9$, $E_9$), multiplication of ($C_3$, $E_3$) and ($C_9$, $E_9$), and multiplication of ($C_8$, $E_8$) and ($C_9$, $E_9$). Then, the fifth element of ($C_9$, $E_9$) is changed to 1. The result of the computation is as follows:

| | | | | | | | | | | | | |
|---|---|---|---|---|---|---|---|---|---|---|---|---|
| ($C_1$, $E_1$): | 1 | 0 | 0 | 0 | 0 | 0 | 0 | 1 | 2 | 3 | 4 | 5 |
| ($C_7$, $E_7$): | 0 | 1 | 140 | 206 | 235 | 37 | 121 | 244 | 114 | 255 | 200 | 69 |
| ($C_3$, $E_3$): | 0 | 0 | 1 | 0 | 0 | 0 | 12 | 13 | 14 | 15 | 16 | 17 |
| ($C_8$, $E_8$): | 0 | 0 | 0 | 1 | 195 | 156 | 38 | 120 | 31 | 65 | 136 | 214 |
| ($C_5$, $E_5$): | 0 | 0 | 0 | 0 | 1 | 0 | 24 | 25 | 26 | 27 | 28 | 29 |
| ($C_9$, $E_9$): | 0 | 0 | 0 | 0 | 0 | 1 | 30 | 31 | 32 | 33 | 34 | 35 |

Step 5: Change the fifth element 235 and third element 140 of ($C_7$, $E_7$), the fifth element 195 of ($C_8$, $E_8$) and the fourth element 206 of ($C_7$, $E_7$) to 0. Therefore, according to the multiplication defined by $GF(2^8)$ to execute the multiplication of ($C_5$, $E_5$) and ($C_7$, $E_7$), multiplication of ($C_3$, $E_3$) and ($C_7$, $E_7$), multiplication of ($C_5$, $E_5$) and ($C_8$, $E_8$), and multiplication of ($C_8$, $E_8$) and ($C_7$, $E_7$). The result of the computation is as follows:

| | | | | | | | | | | | | |
|---|---|---|---|---|---|---|---|---|---|---|---|---|
| ($C_1$, $E_1$): | 1 | 0 | 0 | 0 | 0 | 0 | 0 | 1 | 2 | 3 | 4 | 5 |
| ($C_7$, $E_7$): | 0 | 1 | 0 | 0 | 0 | 191 | 13 | 179 | 118 | 200 | 23 | 169 |
| ($C_3$, $E_3$): | 0 | 0 | 1 | 0 | 0 | 0 | 12 | 13 | 14 | 15 | 16 | 17 |
| ($C_8$, $E_8$): | 0 | 0 | 0 | 1 | 0 | 156 | 220 | 65 | 126 | 227 | 89 | 196 |
| ($C_5$, $E_5$): | 0 | 0 | 0 | 0 | 1 | 0 | 24 | 25 | 26 | 27 | 28 | 29 |
| ($C_9$, $E_9$): | 0 | 0 | 0 | 0 | 0 | 1 | 30 | 31 | 32 | 33 | 34 | 35 |

Finally, Change the sixth element 91 of ($C_7$, $E_7$) and the sixth element 156 of ($C_8$, $E_8$) to 0. Therefore, according to the multiplication defined by $GF(2^8)$ to execute the multiplication of ($C_9$, $E_9$) and ($C_7$, $E_7$), and multiplication of ($C_9$, $E_9$) and ($C_8$, $E_8$). The result of the computation is as follows:

| | | | | | | | | | | | | |
|---|---|---|---|---|---|---|---|---|---|---|---|---|
| ($C_1$, $E_1$): | 1 | 0 | 0 | 0 | 0 | 0 | 0 | 1 | 2 | 3 | 4 | 5 |
| ($C_7$, $E_7$): | 0 | 1 | 0 | 0 | 0 | 0 | 6 | 7 | 8 | 9 | 10 | 11 |
| ($C_3$, $E_3$): | 0 | 0 | 1 | 0 | 0 | 0 | 12 | 13 | 14 | 15 | 16 | 17 |
| ($C_8$, $E_8$): | 0 | 0 | 0 | 1 | 0 | 0 | 18 | 19 | 20 | 21 | 22 | 23 |
| ($C_5$, $E_5$): | 0 | 0 | 0 | 0 | 1 | 0 | 24 | 25 | 26 | 27 | 28 | 29 |
| ($C_9$, $E_9$): | 0 | 0 | 0 | 0 | 0 | 1 | 30 | 31 | 32 | 33 | 34 | 35 |

After the above 5 steps, the receiver successfully reconstructs the original data. Hence, the disclosed method segments the original data into N blocks when the front end transmits the data. The N blocks and coefficient matrix $C_{M \times N}$ are computed to expand into M blocks ($M \leq N$). The M blocks and the coefficients are transmitted together. The receiver only needs to receive any N (or more than N) of the M packaged data transmitted from the front end in order to reconstruct to the original data. Therefore, in the same receiving environment, the time required for receiving complete data may be reduced while maintaining the correctness of the data transmission.

When selecting coefficient matrix $C_{M \times N}$, if the selected coefficient matrix $C_{M \times N}$ is an identity matrix $I_{N \times N}$, the data transmission is compatible with the current DSMCC transmission and receiving system. The decoder of the existing DSMCC transmission and receiving system may also be used to decode the transmitted data to obtain the original data while maintaining the data transmission correctness. This is because the first row to the N-th row of $E_{M \times K}$ are the same as the transmission module obtained by the segmentation of DSMCC. Hence, if the receiver uses the DSMCC manner to receive, the data may also be received correctly.

Figure 5A:
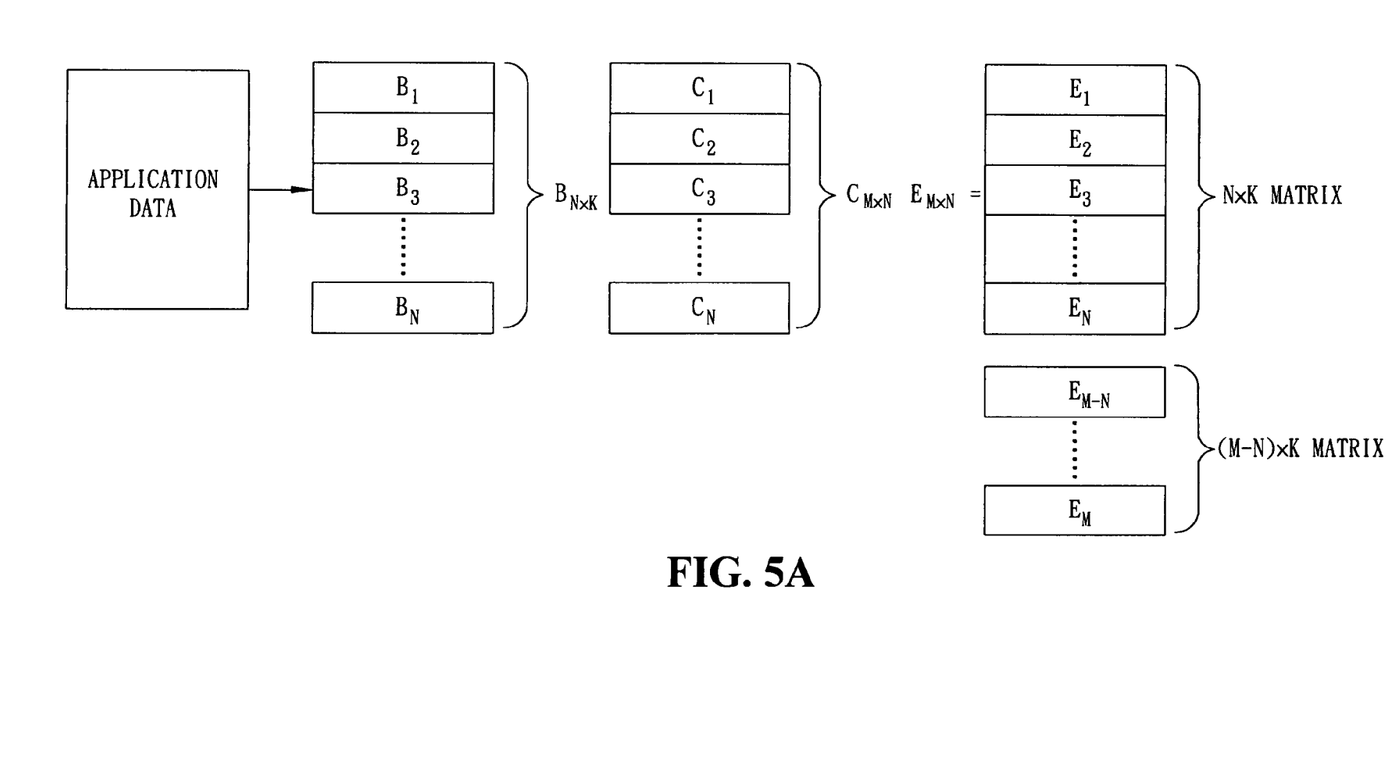
FIG. 5A shows an exemplary schematic view of matrix $B_{N \times K}$, coefficient matrix $C_{M \times N}$, encoded data module $E_{M \times K}$, consistent with certain disclosed embodiments.
Figure 5B:
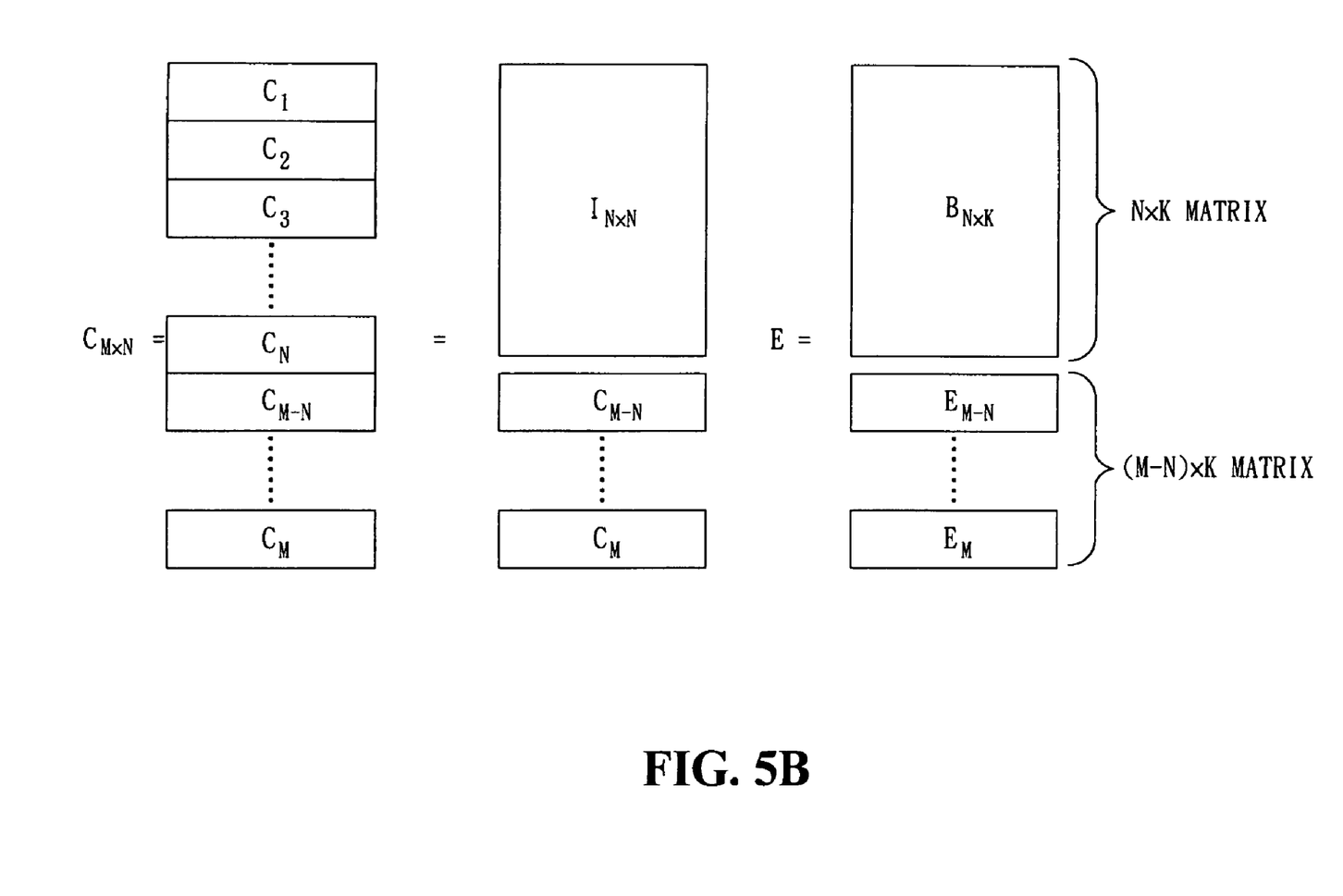
FIG. 5B shows an exemplary schematic view of the relationship among matrix $B_{N \times K}$, coefficient matrix $C_{M \times N}$, encoded data module $E_{M \times K}$, consistent with certain disclosed embodiments.

FIGS. 5A & 5B show an exemplary schematic view of the relation among matrix $B_{N \times K}$, matrix $C_{M \times N}$ and encoded data module $E_{M \times K}$, consistent with certain disclosed embodiments. FIG. 5A shows an exemplary schematic view of matrix $B_{N \times K}$, coefficient matrix $C_{M \times N}$, encoded data module $E_{M \times K}$, consistent with certain disclosed embodiments. During selecting matrix $C_{M \times N}$, for example, using an identity matrix formed by $C_1$ to $C_N$ as example, FIG. 5B shows that encoded data module $E_{M \times K}$ is made of matrix $B_{N \times K}$ and expanded row matrixes $E_{M-N}$ to $E_M$.

In the examples of FIGS. 5A & 5B, M>N. The contents of row matrixes $E_{M-N}$ to $E_M$ may be randomly generated by $GF(2^n)$, where n is selected according to the smallest unit of the application data to be processed, for example, if the minimum unit of the application data is 8-bit, n is selected to be 8. Because matrix $C_{M \times N}$ is a coefficient matrix, $B_{N \times K}$ is from segmenting the original data and encoded data module $E_{M \times K} = C_{M \times N} \times B_{N \times K}$, therefore, may use a linear combination encoding to encode the data.

When the front end transmits data, according to some embodiments, the coefficient part (i.e., $C_1$-$C_M$) is also transmitted along with data blocks (i.e., $E_1$-$E_M$). In this manner, the receiver only needs to receive any N (or more than N) packaged data to reconstruct the original data.

Figure 6:
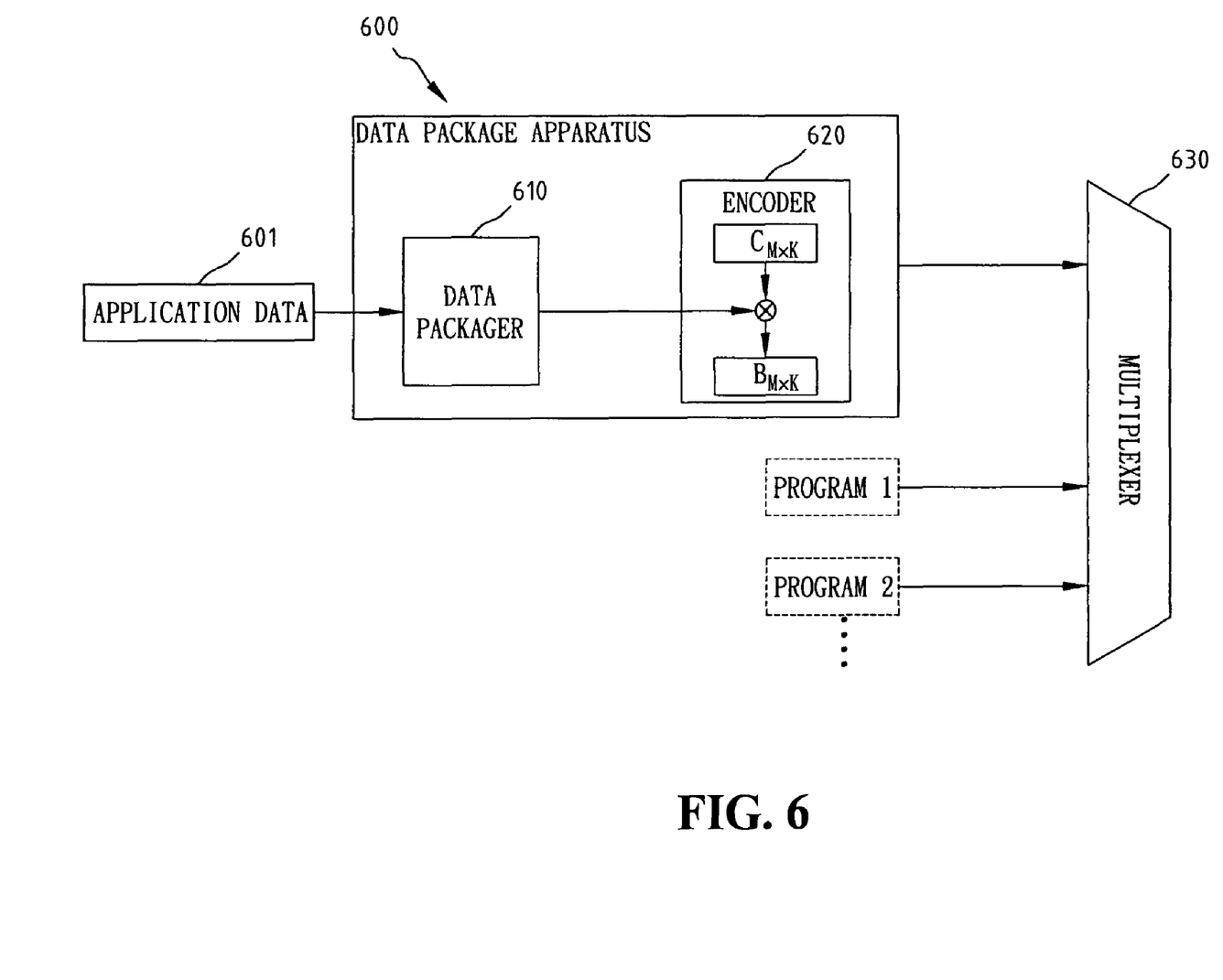
FIG. 6 shows an exemplary schematic view of an apparatus for data package in broadcast networks, consistent with certain disclosed embodiments.

FIG. 6 shows an exemplary schematic view of an apparatus for data package in broadcast networks, consistent with certain disclosed embodiments. The apparatus may be arranged at the receiver of a transmission and receiving system in a broadcast network environment. Referring to FIG. 6, data package apparatus 600 includes a data packager 610, and an encoder 620. Encoder 620 is connected to data packager 610. Data package apparatus 600 is connected externally to a multiplexer 630.

Data packager 610 segments N×K pieces of inputted application data 601 into a matrix $B_{N \times K}$ formed by N blocks $B_1$-$B_N$, and N is a positive integer greater than 1. Encoder 620 selects M row matrixes $C_1$-$C_M$, and performs linear combination encoding on N blocks $B_1$-$B_N$ and M row matrixes $C_1$-$C_M$ to generate an encoded data module $E_{M \times K}$ formed by M row matrixes $E_1$-$E_M$. Then, each row matrix $C_i$ is packaged with the data of row matrix $E_I$, and the M packaged data ($C_I$, $E_I$) are transmitted, where M≧N and 1≦I≦M. As aforementioned, N blocks $B_1$-$B_N$ forms a matrix $B_{N \times K}$, with each of N blocks containing K pieces of application data, and K is an integer greater than 1. M row matrixes, $C_1$-$C_M$, form a coefficient matrix $C_{M \times N}$. The encoded data module $E_{M \times K}$ is the matrix multiplication of coefficient matrix $C_{M \times N}$ and matrix $B_{N \times K}$.

Figure 7:
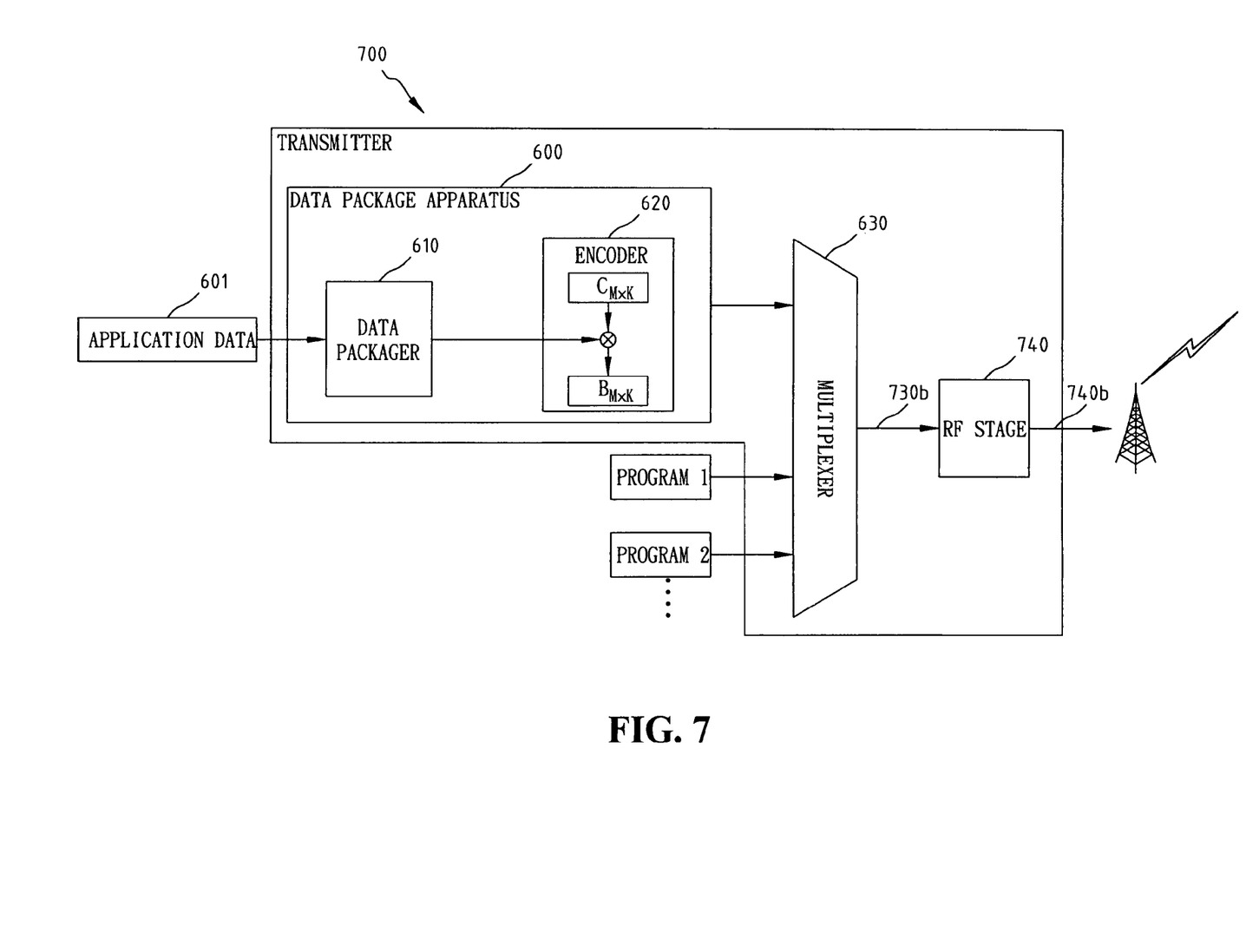
FIG. 7 shows an exemplary schematic view of a transmitter in broadcast networks, consistent with certain disclosed embodiments.

The decoder of existing DSM CC transmission and receiving system may also be used to decode the data transmitted from data package apparatus 600 to obtain the original data while maintaining the correctness of data transmission. Data package apparatus 600 may be combined with a multiplexer 630 and a radio frequency (RF) stage to form a transmitter of a broadcast network. As shown in FIG. 7, an exemplary transmitter 700 may comprise a data package apparatus 600, a multiplexer 630, and an RF stage 740. Multiplexer 630 mixes at least a program, for example, TV program 1 and TV program 2, and the M packaged data ($C_I$, $E_I$), where 1≦I≦M, into a transport stream 730b. RF stage 740 modulates and shifts transport stream 730b to convert into a suitable digital video broadcast (DVB) signal 740b for transmission. In this manner, transmitter 700 is compatible with the DSMCC transmission and receiving system.

Figure 8:
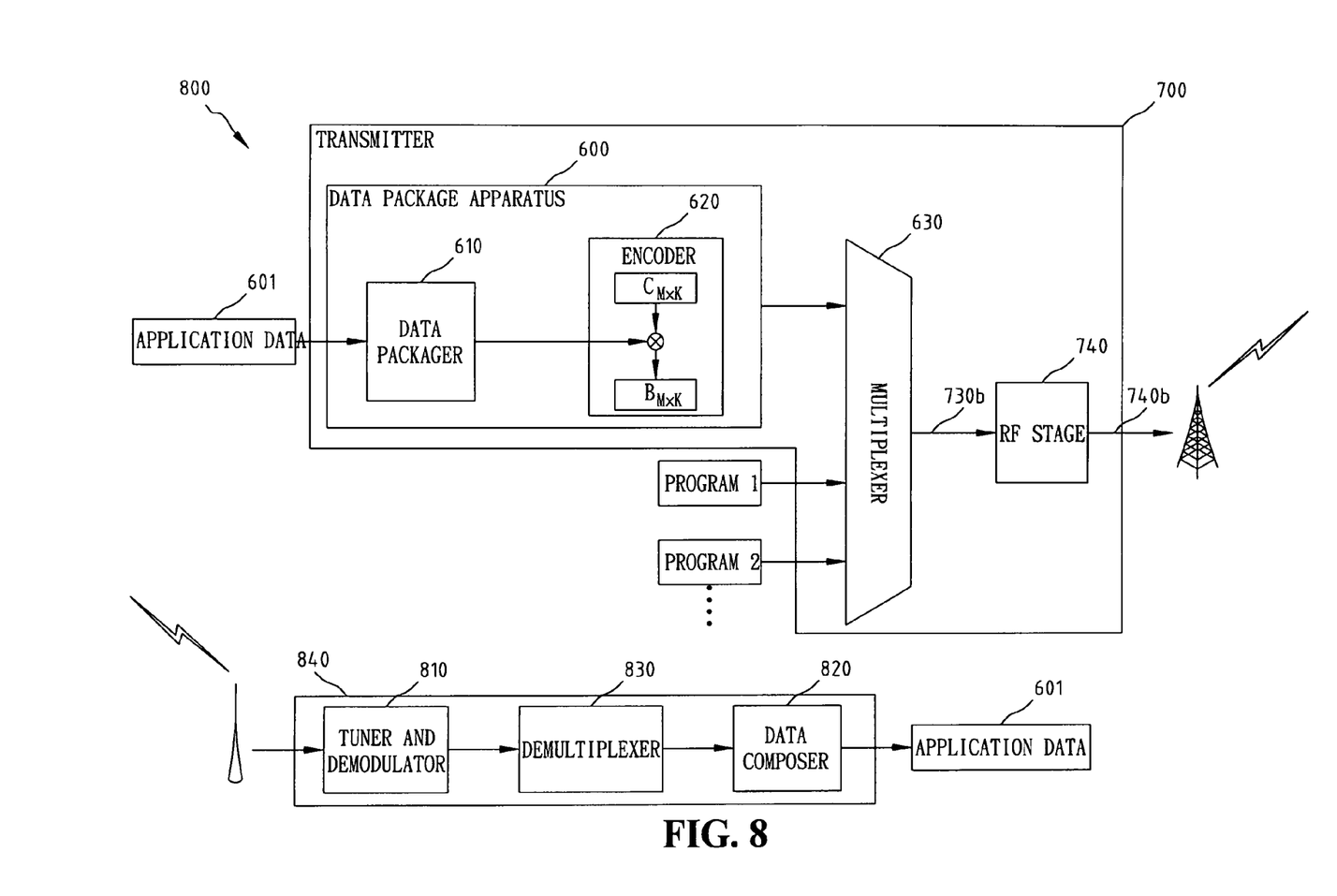
FIG. 8 shows an exemplary schematic view of a transmission and receiving system in broadcast networks, consistent with certain disclosed embodiments.

Transmitter 700 may be combined with a receiver to form a transmission and receiving system of broadcast networks. As shown in FIG. 8, transmission and receiving system 800 may comprises a transmitter 700 and a receiver 840. Receiver 840 at least includes a data composer 820 and may further include a tuner and demodulator 810 and a demultiplexer 830. Tuner and demodulator 810 tunes and demodulates DVB signal 740b and turns RF into transport stream 810b of digital base frequency. Demultiplexer 830 separates the program and M packaged data ($C_I$, $E_I$) from transport stream 810b of digital base frequency and filters to obtain the M packaged data ($C_I$, $E_I$) to transmit to data composer 820. Data composer 820 uses a Gaussian elimination to obtain matrix $B_{N \times K}$ and restores to original application data 601.

As aforementioned, to be compatible with the existing DSMCC transmission and receiving system, when selecting coefficient matrix $C_{M \times N}$, decoder 620 may select N row matrixes $C_1$-$C_N$ so that $C_1$-$C_N$ forms an identity matrix $I_{N \times N}$. Because M row matrixes $E_1$-$E_M$ are the same as the $B_{N \times K}$ obtained when the original DSMCC segmenting, receiver 840 may also correctly receive data by using the original DSMCC transmission protocol.

Figure 9:
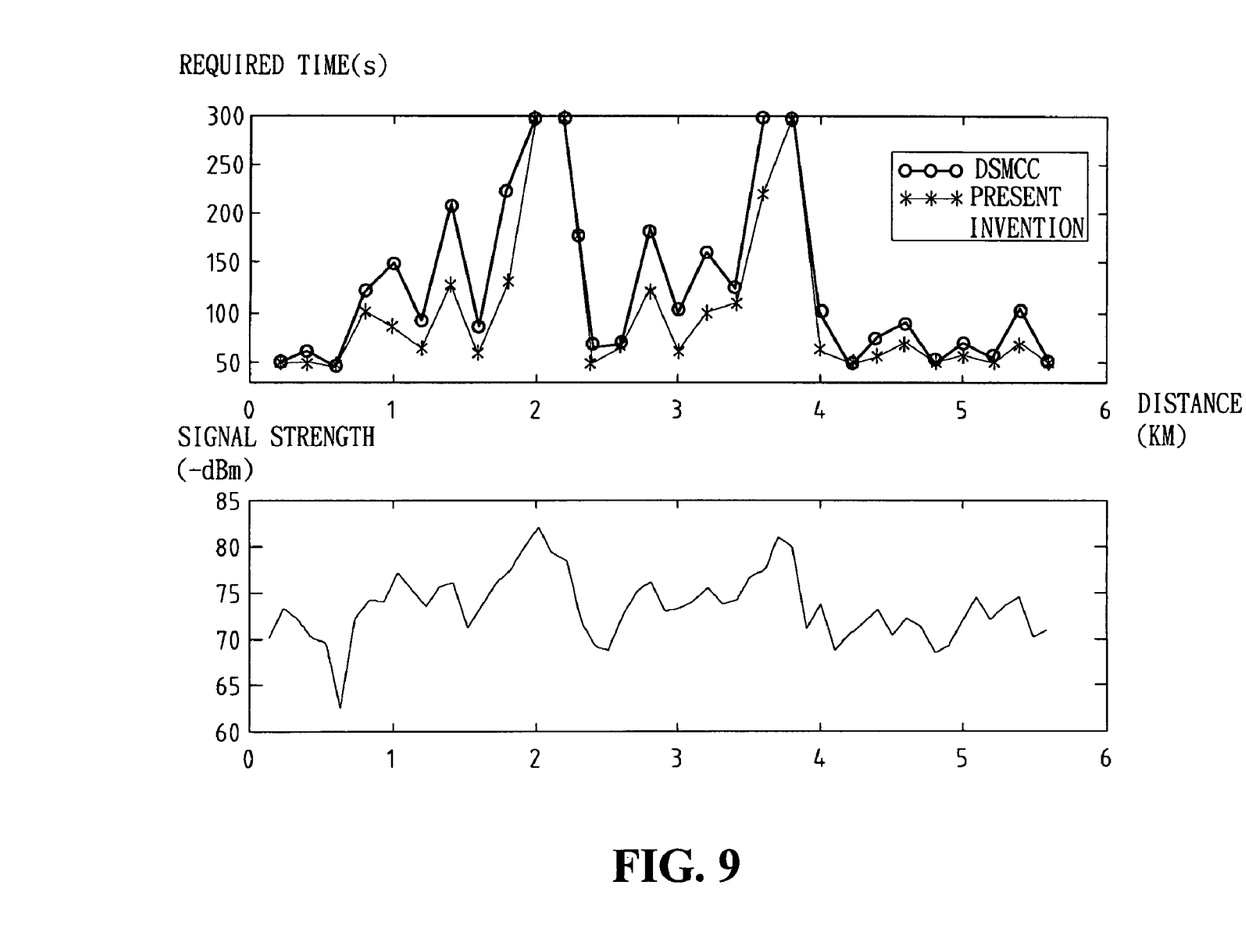
FIG. 9 shows an exemplary experiment result of the time required for complete receiving by using the transmission mechanism of the present invention and the existing DSMCC transmission mechanism, consistent with certain disclosed embodiments.

A field test is used to validate the disclosed technique. An experiment is conducted on a segment between one location and another location, with a point of data receiving for every 200 meters. In the situation of the same data transmission bandwidth, such as 350 Kbps and the same data amount, such as, 1.9 MB, the data transmission in this experiment is conducted in two manners: (a) the data transmission structure, where the data amount is segmented into 30 data blocks and encodes with linear combination encoding to generate 60 encoded blocks; and (b) the existing DSMCC transmission mechanism, where the data amount is segmented into 30 blocks only. Then, the receiving times for complete receiving for (a) and (b) are compared. FIG. 9 shows the exemplary figures of the experiment result. A shown in FIG. 9, for complete receiving of the 30 blocks, the time required is shorter than the time required by the DSMCC transmission and receiving system.

Furthermore, if a certain data block i of N data blocks is missing, the experiment result also discloses the effectiveness of the data package mechanism. In other words, the missing i-th block needs to wait for the data transmission for complete receiving. There are four transmission and receiving combination scenarios, shown as follows.

The first scenario is to use the transmission mechanism to transmit M packaged data and to use the transmission mechanism to receive N data blocks completely. The second scenario is to use the transmission mechanism to transmit M packaged data and to use the DSMCC transmission mechanism to receive N data blocks completely. The third scenario is to use the DSMCC transmission mechanism n to transmit N data blocks and to use the transmission mechanism to receive N data blocks completely. The fourth scenario is to use the DSMCC transmission mechanism to transmit N data blocks and to use the DSMCC transmission mechanism to receive N data blocks completely.

The performance analysis of the above four scenarios is as follows. The first scenario needs to wait for transmission of N+1 data blocks. The second scenario needs to wait for transmission of M+i data blocks. The third scenario needs to wait for transmission of N+i data blocks. The fourth scenario needs to wait for transmission of N+i data blocks.

In summary, a method and apparatus for data package in broadcast networks is provided. By using data package technique combined with matrix transformation and Galois Field theory, segmenting the application data into plural data blocks so that when transmitting file or data in a broadcast network, the time required for complete receiving at the receiver may be shortened while maintaining the data transmission correctness. The data package mechanism is compatible with the existing DSMCC transmission and receiving system and may be arranged into a transmitter of a transmission and receiving system in broadcast networks. The transmitter may be also combined with a receiver to form a transmission and receiving system in broadcast networks.

Although exemplary embodiments have been described it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method for data package in broadcast networks, comprising:

segmenting N×K pieces of inputted application data into a matrix $B_{N \times K}$ formed by N blocks $B_1$-$B_N$, with each of N blocks containing K pieces of application data, and both N and K being integers greater than 1;

selecting a matrix $C_{M \times N}$ formed by M row matrixes $C_1$-$C_M$, with full column rank N, where M≧N, and both being positive integers;

performing matrix multiplication on $C_{M \times N}$ and $B_{N \times K}$ to produce an encoded data module consisting of M row matrix $E_1$-$E_M$; and for each I, 1≦I≦M, packaging two row matrixes $C_I$ and $E_I$, and transmitting all of the M packaged data ($C_I$, $E_I$).

2. The method for data package in broadcast networks as claimed in claim 1, wherein row matrixes $C_1$-$C_N$ of said matrix $C_{M \times N}$ form an N×N identity matrix.

3. The method for data package in broadcast networks as claimed in claim 2, wherein said data transmission method is compatible with transmission and receiving system of digital storage media, command and control.

4. The method for data package in broadcast networks as claimed in claim 1, wherein elements of row matrixes $C_1$-$C_M$ of said matrix $C_{M \times N}$ are randomly generated from Galois Field $GF(2^n)$, n is a positive integer and the selection of n is determined by the smallest unit of said application data to be processed.

5. The method for data package in broadcast networks as claimed in claim 1, wherein M is a pre-defined positive integer.

6. The method for data package in broadcast networks as claimed in claim 1, wherein the receiver of said broadcast networks only needs to receive any N packaged data of said M packaged data ($C_I$, $E_I$), 1≦I≦M, and said N×K pieces of inputted application data is reconstructed by performing a Gaussian elimination on said received N packaged data.

7. The method for data package in broadcast networks as claimed in claim 1, wherein said matrix multiplication is executed according to the multiplication defined by $GF(2^n)$, n is a positive integer and the selection of n is determined by the smallest unit of said application data to be processed.

8. The method for data package in broadcast networks as claimed in claim 1, wherein said application data is input file or stream.

9. The method for data package in broadcast networks as claimed in claim 1, said method does not need to distinguish whether said N×K pieces of inputted application data is ordered or not.

10. The method for data package in broadcast networks as claimed in claim 1, said method uses a linear combination encoding to rearrange and encode data.

11. An apparatus for data package in broadcast networks, comprising:

a data packager, for segmenting N×K pieces of inputted application data into N blocks $B_1$-$B_N$, N being an greater than 1; and an encoder connected to said data packager, selecting M row matrixes $C_1$-$C_M$, performing a linear combination encoding on said N blocks $B_1$-$B_N$ and said M row matrixes $C_1$-$C_M$ to generate an encoded data module formed by M row matrixes E-$E_M$, packaging coefficient of each block $C_I$ with that of block $E_I$, and transmitting M packaged data ($C_I$, $E_I$), where M≧N and 1≦I≦M.

12. The apparatus for data package in broadcast networks as claimed in claim 11, said apparatus is arranged in a transmitter of a transmission and receiving system in broadcast networks.

13. The apparatus for data package in broadcast networks as claimed in claim 11, wherein said N blocks $B_1$-$B_N$ forms an N×K matrix $B_{N \times K}$, with each of said N blocks containing K pieces of application data, K is an integer greater than 1, M row matrixes $C_1$-$C_M$ forms a coefficient matrix $C_{M \times N}$, and said encoded data module $E_{M \times K}$ is the matrix multiplication of coefficient matrix $C_{M \times N}$ and matrix $B_{N \times K}$.

14. The apparatus for data package in broadcast networks as claimed in claim 11, said apparatus is connected to a multiplexer externally.

15. A transmitter in broadcast network, said transmitter comprising:

a data package apparatus, for segmenting N×K pieces of inputted application data into N blocks $B_1$-$B_N$, selecting M row matrixes $C_1$-$C_M$, performing a linear combination encoding on coefficient matrix $C_{M \times N}$ and N blocks $B_{N \times K}$ to generate an encoded data module $E_{M \times K}$, and transmitting M packaged data ($C_I$, $E_I$), where N and K are integers greater than 1, M≧N and 1≦I≦M, a multiplexer, for mixing at least a program and said M packaged data ($C_I$, $E_I$) into a transport stream; and a radio frequency stage, for modulating and shifting frequency of said transport stream to convert into at least a suitable digital video broadcast signal for transmission.

16. The transmitter as claimed in claim 15, wherein said N blocks $B_1$-$B_N$ forms an N×K matrix $B_{N \times K}$, K is an integer greater than 1, said M row matrixes $C_1$-$C_M$ forms a coefficient matrix $C_{M \times N}$, and said encoded data module $E_{M \times K}$ is the matrix multiplication of coefficient matrix $C_{M \times N}$ and matrix $B_{N \times K}$.

17. The transmitter as claimed in claim 16, wherein said encoded data module $E_{M \times K}$ is formed by said N×K application data and expanded N row matrixes $E_{M-N}$-$E_M$.

18. The transmitter as claimed in claim 15, wherein said transmitter is compatible with transmission and receiving system for digital storage media, command and control.

19. A transmission and receiving system in broadcast networks, comprising:

a transmitter, at least having a data package apparatus to segment N×K pieces of inputted application data into N blocks $B_1$-$B_N$, select M row matrixes $C_1$-$C_M$, perform a linear combination encoding on coefficient matrix $C_{M \times N}$ and N blocks $B_{N \times K}$ to generate an encoded data module $E_{M \times K}$ formed by M row matrixes $E_1$-$E_M$, and then transmit M packaged data ($C_I$, $E_I$), where N and K are integers greater than 1, M≧N and 1≦I≦M; and a receiver, at least having a data composer, using a Gaussian elimination to obtain N blocks $B_1$-$B_N$ from M packaged data and reconstructing to said N×K pieces of inputted application data.

20. The transmission and receiving system as claimed in claim 19, wherein said transmitter further comprises a multiplexer and a radio frequency stage.

21. The transmission and receiving system as claimed in claim 19, wherein said receiver further includes a tuner and demodulator and a demultiplexer.

* * * * *